(12) United States Patent  (10) Patent No.: US 8,384,130 B2
Jeon et al.  (45) Date of Patent: Feb. 26, 2013

(54) NITRIDE SEMICONDUCTOR DEVICE HAVING A TWO-DIMENSIONAL ELECTRON GAS (2DEG) CHANNEL

(75) Inventors: Woo Chul Jeon, Gyeonggi-do (KR); Ki Yeol Park, Gyeonggi-do (KR); Young Hwan Park, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/137,291

(22) Filed: Aug. 3, 2011

(65) Prior Publication Data

US 2012/0267686 A1 Oct. 25, 2012

(30) Foreign Application Priority Data

Apr. 25, 2011 (KR) .......................... 10-2011-0038612

(51) Int. Cl.
 H01L 29/739 (2006.01)
 H01L 31/0328 (2006.01)
 H01L 31/0336 (2006.01)
 H01L 31/072 (2006.01)
 H01L 31/109 (2006.01)
(52) U.S. Cl. .................. 257/194; 257/195; 257/E29.11; 257/E29.19; 257/E29.246; 257/E29.247; 257/E29.248; 257/E29.249; 257/E29.25; 257/E29.251; 257/E29.252; 257/E29.253; 257/E29.254
(58) Field of Classification Search .................. 257/194, 257/195, E29.11, E29.19, E29.246, E29.247, 257/E29.248, E29.249, E29.25, E29.251, 257/E29.252, E29.253, E29.254
See application file for complete search history.

(56) References Cited

U.S. PATENT DOCUMENTS

| | | | | |
|---|---|---|---|---|
| 6,690,042 | B2 | 2/2004 | Khan et al. | 257/192 |
| 7,573,078 | B2 * | 8/2009 | Wu et al. | 257/194 |
| 7,696,535 | B2 * | 4/2010 | Yang et al. | 257/194 |
| 7,745,848 | B1 * | 6/2010 | Rajagopal et al. | 257/192 |
| 7,800,131 | B2 * | 9/2010 | Miyamoto et al. | 257/192 |
| 8,169,005 | B2 * | 5/2012 | Wu et al. | 257/194 |
| 2008/0204140 | A1 * | 8/2008 | Kikkawa et al. | 330/277 |
| 2009/0045439 | A1 * | 2/2009 | Hoshi et al. | 257/194 |
| 2010/0314663 | A1 * | 12/2010 | Ito et al. | 257/192 |
| 2011/0057233 | A1 * | 3/2011 | Park et al. | 257/194 |
| 2011/0233520 | A1 * | 9/2011 | Jeon et al. | 257/20 |
| 2011/0233612 | A1 * | 9/2011 | Park et al. | 257/194 |
| 2012/0146095 | A1 * | 6/2012 | Park et al. | 257/194 |
| 2012/0146096 | A1 * | 6/2012 | Park et al. | 257/194 |

FOREIGN PATENT DOCUMENTS

JP 04130780 A * 5/1992
KR 10-2005-0010004 1/2005

* cited by examiner

*Primary Examiner* — Ida M Soward

(57) ABSTRACT

Provided is a nitride semiconductor device including: a nitride semiconductor layer over a substrate wherein the nitride semiconductor has a two-dimensional electron gas (2DEG) channel inside; a drain electrode in ohmic contact with the nitride semiconductor layer; a source electrode spaced apart from the drain electrode, in Schottky contact with the nitride semiconductor layer, and having an ohmic pattern in ohmic contact with the nitride semiconductor layer inside; a dielectric layer formed on the nitride semiconductor layer between the drain electrode and the source electrode and on at least a portion of the source electrode; and a gate electrode disposed on the dielectric layer to be spaced apart from the drain electrode, wherein a portion of the gate electrode is formed over a drain-side edge portion of the source electrode with the dielectric layer interposed therebetween, and a manufacturing method thereof.

17 Claims, 6 Drawing Sheets

- PRIOR ART -

- PRIOR ART -

NITRIDE SEMICONDUCTOR DEVICE HAVING A TWO-DIMENSIONAL ELECTRON GAS (2DEG) CHANNEL

CROSS-REFERENCE TO RELATED APPLICATIONS

This application claims the benefit under 35 U.S.C. Section 119 of Korean Patent Application Serial No. 10-2011-0038612, filed Apr. 25, 2011, which is hereby incorporated by reference in its entirety into this application.

BACKGROUND OF THE INVENTION

1. Field of the Invention

The present invention relates to a nitride semiconductor device and a manufacturing method thereof, and more particularly, to a nitride semiconductor device capable of normally-off operation, and a manufacturing method thereof.

2. Description of the Related Art

There has been growing interest in reduction of power consumption due to green energy policy. To achieve this, improvement in power conversion efficiency is necessary. In the power conversion, efficiency of a power switching device has influence on the entire power conversion efficiency.

At present, most of power devices generally used are power MOSFETs or IGBTs using silicon. However, an increase in efficiency of the devices is limited due to material limitations of silicon. To overcome this, there have been patent applications which are to increase the conversion efficiency by manufacturing a transistor using a nitride semiconductor such as gallium nitride (GaN).

However, for example, a high electron mobility transistor (HEMT) structure using GaN becomes ON state in which current flows due to low resistance between a drain electrode and a source electrode when a gate voltage is 0V (normal state). Accordingly, this causes consumption of current and power, and there is a disadvantage that a negative voltage (for example, −5V) should be applied to a gate electrode so that the HEMT structure becomes OFF state (normally-on structure).

To overcome this disadvantage of the normally-on structure, patent applications as shown in FIGS. 6 and 7 were disclosed. FIGS. 6 and 7 show conventional HEMT structures.

FIG. 6 shows a drawing disclosed in publicized U.S. patent No. 2007-0295993. As shown in FIG. 6, in an AlGaN layer, concentration of a channel formed during growth of the AlGaN layer 133 is adjusted by implanting ions into a region under a gate G and a region adjacent to a gate electrode G between the gate G and a drain D. In FIG. 6, normally-off operation is implemented by controlling carrier concentration of a channel region 131 under the gate G by using ion implantation.

FIG. 7 is a drawing disclosed in U.S. Pat. No. 7,038,253. A 2DET channel 135 is prevented from being formed under a gate electrode G by applying an insulation layer 140 on a channel layer 131 formed between first and second electron donor layers 133a and 133b and forming the gate electrode G on the insulation layer 140. In FIG. 7, normally-off operation is implemented by etching under a gate G through a recess process.

SUMMARY OF THE INVENTION

There is a need for implementing a semiconductor device which operates normally-off and overcomes the problems of the normally-on structure as described above.

The present invention has been invented in order to overcome the above-described problems and it is, therefore, an object of the present invention to provide a semiconductor device capable of normally-off (N-off) or enhancement-mode operation and high withstand voltage and high current operation by forming a Schottky electrode, which has an ohmic pattern electrode inside, in a source region of a semiconductor device, for example, an FET and forming a gate electrode in a portion of a source electrode region and in a portion of a nitride semiconductor region, and a manufacturing method thereof.

In accordance with one aspect of the present invention to achieve the object, there is provided a nitride semiconductor device including: a nitride semiconductor layer over a substrate wherein the nitride semiconductor has a two-dimensional electron gas (2DEG) channel inside; a drain electrode in ohmic contact with the nitride semiconductor layer; a source electrode spaced apart from the drain electrode, in Schottky contact with the nitride semiconductor layer, and having an ohmic pattern in ohmic contact with the nitride semiconductor layer inside; a dielectric layer formed on the nitride semiconductor layer between the drain electrode and the source electrode and on at least a portion of the source electrode; and a gate electrode disposed on the dielectric layer to be spaced apart from the drain electrode, wherein a portion of the gate electrode is formed over a drain-side edge portion of the source electrode with the dielectric layer interposed therebetween.

In accordance with another aspect of the present invention, the portion of the gate electrode being formed over the drain-side edge portion of the source electrode is formed to cover at least a portion of the ohmic pattern of the source electrode.

In accordance with another aspect of the present invention, the ohmic pattern has a grid array structure.

In accordance with another aspect of the present invention, the ohmic pattern has a plurality of bar structures disposed in parallel or vertical to the drain electrode array.

In accordance with another aspect of the present invention, the nitride semiconductor layer includes a first nitride layer over the substrate wherein the first nitride layer contains a gallium nitride (GaN)-based material; and a second nitride layer in heterojunction with and on the first nitride layer wherein the second nitride layer contains a heterogeneous GaN-based material with a wider energy band gap than the first nitride layer.

Preferably, the first nitride layer contains GaN, and the second nitride layer contains one of aluminum gallium nitride (AlGaN), indium gallium nitride (InGaN), and indium aluminum gallium nitride (InAlGaN).

In accordance with another aspect of the present invention to achieve the object, there is provided a nitride semiconductor device including: a nitride semiconductor layer over a substrate wherein the nitride semiconductor has a 2DEG channel inside; a drain electrode in ohmic contact with the nitride semiconductor layer; a source electrode spaced apart from the drain electrode, in Schottky contact with the nitride semiconductor layer, and having an ohmic pattern in ohmic contact with the nitride semiconductor layer inside; a dielectric layer formed on the nitride semiconductor layer between the drain electrode and the source electrode and on at least a portion of the source electrode; and a gate electrode having a first region formed over a drain-side edge portion of the source electrode with the dielectric layer interposed therebetween and a second region disposed on the dielectric layer between the drain electrode and the source electrode to be spaced apart from the drain electrode.

In accordance with another aspect of the present invention, the first region and the second region of the gate electrode are separately formed, and the second region forms a floating gate.

In accordance with another aspect of the present invention, the first region is formed to cover at least a portion of the ohmic pattern of the source electrode.

In accordance with another aspect of the present invention, the ohmic pattern has a grid array structure.

In accordance with another aspect of the present invention, the ohmic pattern has a plurality of bar structures disposed in parallel or vertical to the drain electrode array.

In accordance with another aspect of the present invention, the nitride semiconductor layer includes a first nitride layer over the substrate wherein the first nitride layer contains a GaN-based material; and a second nitride layer in heterojunction with and on the first nitride layer wherein the second nitride layer contains a heterogeneous GaN-based material with a wider energy band gap than the first nitride layer. Preferably, the first nitride layer contains GaN, and the second nitride layer contains one of AlGaN, InGaN, and InAlGaN.

In the above-described aspects of the present invention, in accordance with another feature, the nitride semiconductor device further includes a buffer layer between the substrate and the nitride semiconductor layer.

In the above-described aspects of the present invention, in accordance with another feature, the substrate is a substrate using at least one of silicon (Si), silicon carbide (SiC), and sapphire ($Al_2O_3$).

In the above-described aspects of the present invention, in accordance with another feature, the dielectric layer contains at least one of SiN, $SiO_2$, and $Al_2O_3$.

In the above-described aspects of the present invention, in accordance with another feature, the nitride semiconductor device is a power transistor device.

In accordance with still another aspect of the present invention to achieve the object, there is provided a method of manufacturing a nitride semiconductor device including the steps of: forming a nitride semiconductor layer over a substrate wherein the nitride semiconductor layer has a 2DEG channel inside; forming a drain electrode in ohmic contact with the nitride semiconductor layer and a source electrode spaced apart from the drain electrode, in Schottky contact with the nitride semiconductor layer, wherein the source electrode has an ohmic pattern in ohmic contact with the nitride semiconductor layer inside; forming a dielectric layer on the nitride semiconductor layer between the drain electrode and the source electrode and on at least a portion of the source electrode; and forming a gate electrode on the dielectric layer to be spaced apart from the drain electrode, wherein a portion of the gate electrode is formed on the dielectric layer over a drain-side edge portion of the source electrode.

In accordance with another aspect of the present method, in the step of forming the gate electrode, the portion of the gate electrode being formed over the drain-side edge portion of the source electrode is formed to cover at least a portion of the ohmic pattern of the source electrode.

In accordance with another aspect of the present method, in the step of forming the source electrode, the ohmic pattern has a grid array structure or in accordance with another aspect of the present method, in the step of forming the source electrode, the ohmic pattern has a plurality of bar structures disposed in parallel or vertical to the drain electrode array.

In accordance with another aspect of the present method, the step of forming the nitride semiconductor layer includes the steps of: forming a first nitride layer containing a GaN-based material over the substrate through an epitaxial growth process; and forming a second nitride layer containing a heterogeneous GaN-based material with a wider energy band gap than the first nitride layer through an epitaxial growth process by using the first nitride layer as a seed layer.

In accordance with still another aspect of the present invention to achieve the object, there is provided a method of manufacturing a nitride semiconductor device including the steps of: forming a nitride semiconductor layer over a substrate wherein the nitride semiconductor layer has a 2DEG channel inside; forming a drain electrode in ohmic contact with the nitride semiconductor layer and a source electrode spaced apart from the drain electrode, in Schottky contact with the nitride semiconductor layer, wherein the source electrode has an ohmic pattern in ohmic contact with the nitride semiconductor layer inside; forming a dielectric layer on the nitride semiconductor layer between the drain electrode and the source electrode and on at least a portion of the source electrode; and forming a gate electrode having a first region formed over a drain-side edge portion of the source electrode with the dielectric layer interposed therebetween and a second region disposed on the dielectric layer between the drain electrode and the source electrode to be spaced apart from the drain electrode.

In accordance with another aspect of the present method, in the step of forming the gate electrode, the first region and the second region of the gate electrode are separately formed, and the second region is formed as a floating gate on the dielectric layer between the drain electrode and the source electrode.

In accordance with another aspect of the present method, in the step of forming the gate electrode, the first region of the gate electrode is formed to cover at least a portion of the ohmic pattern of the source electrode.

Further, in the above-described aspects of the present invention, according to another feature, the method of manufacturing a nitride semiconductor layer further includes the step of forming a buffer layer over the substrate before forming the nitride semiconductor layer over the substrate.

Although not explicitly described as preferable one aspect of the present invention, embodiments of the present invention in accordance with possible various combinations of the above-described technical features can be apparently implemented by those skilled in the art.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
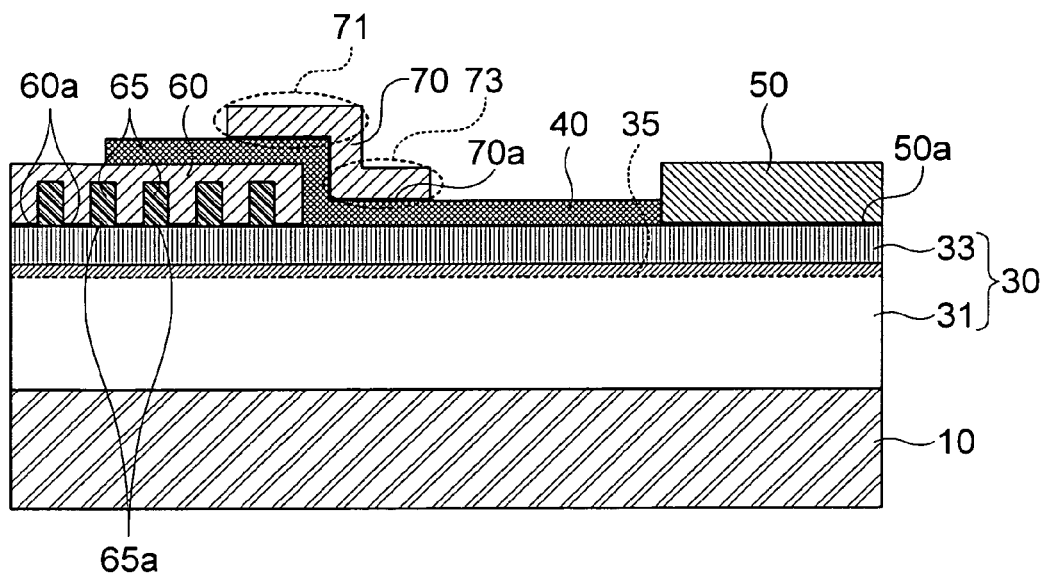
FIG. 1 is a rough cross-sectional view of a nitride semiconductor device in accordance with an embodiment of the present invention.

Embodiments of the present invention to achieve the above objects will be described with reference to the accompanying drawings. In the following description, the same elements are represented by the same reference numerals, and additional description which is repeated or limits interpretation of the meaning of the invention may be omitted.

Before the specific description, in this specification, when an element is referred to as being "connected" or "coupled" to another element, it can be "directly" connected or coupled to the other element or connected or coupled to the other element with another element interposed therebetween, unless it is referred to as being "directly connected" or "directly coupled" to the other element.

Although the singular form is used in this specification, it should be noted that the singular form can be used as the concept representing the plural form unless being contradictory to the concept of the invention or clearly interpreted otherwise. It should be understood that the terms such as "having", "including", and "comprising" used herein do not preclude existence or addition of one or more other features or elements or combination thereof.

Further, the drawings referred to in this specification are ideal exemplary drawings for describing the embodiments of the present invention, and the size and thickness of films or layers or regions may be overdrawn for effective description of technical contents. Further, the shape of regions illustrated in the drawings is not intended to limit the scope of the invention, but is to illustrate the specific form of regions of devices.

Hereinafter, a semiconductor device and a manufacturing method thereof in accordance with embodiments of the present invention will be specifically described with reference to the accompanying drawings.

Figure 4A:
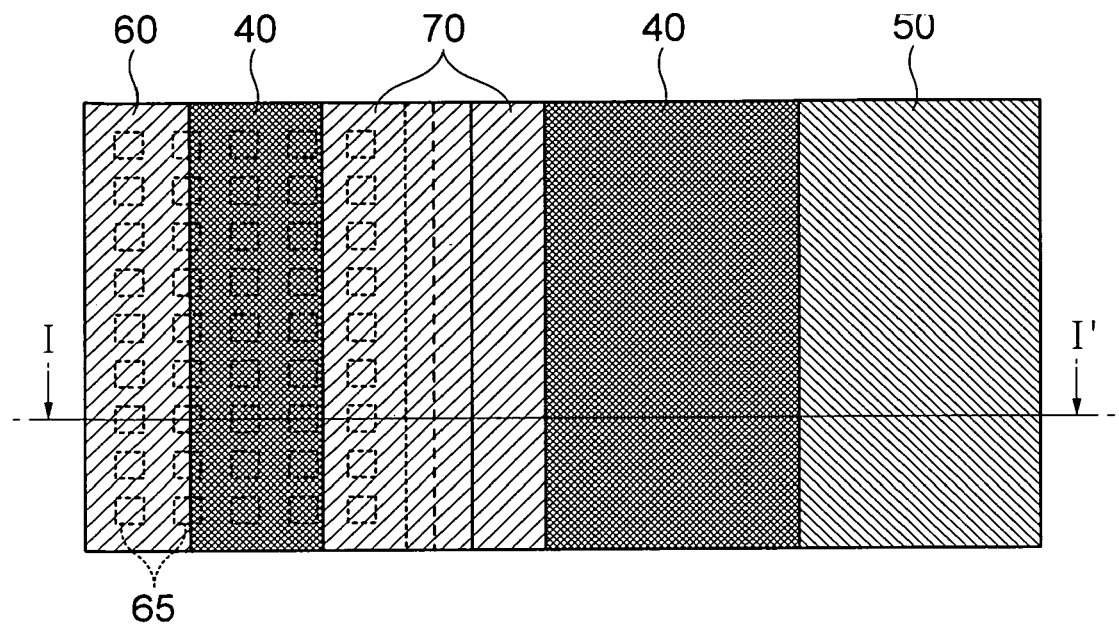
FIGS. 4a to 4c are rough plan views of a nitride semiconductor device in accordance with an embodiment of the present invention.
Figure 4B:
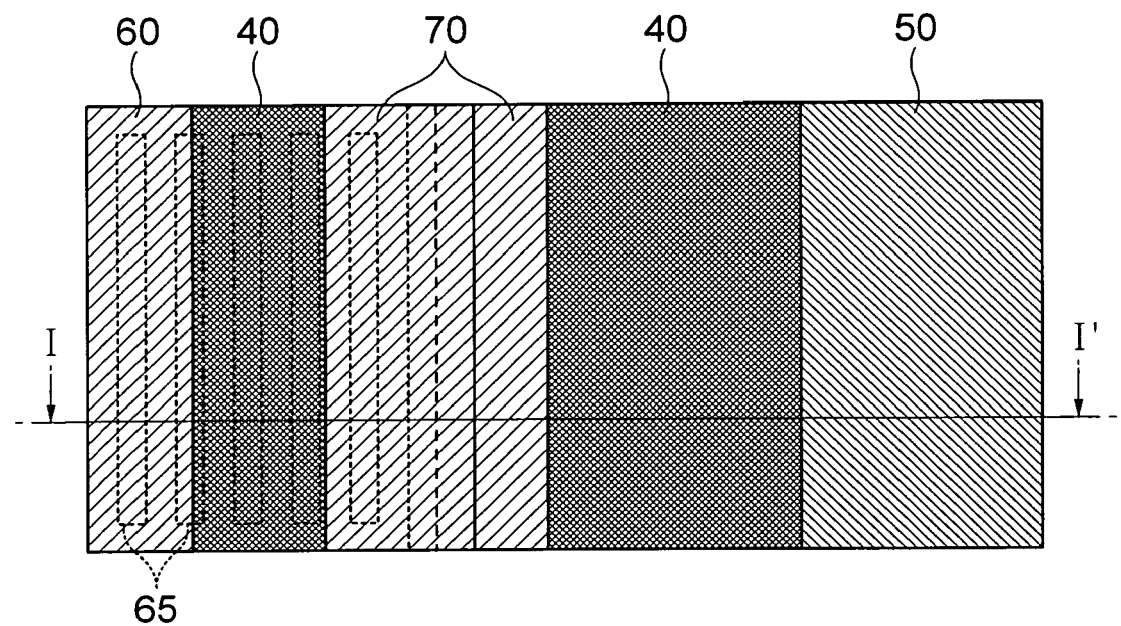

FIG. 1 is a rough cross-sectional view of a nitride semiconductor device in accordance with an embodiment of the present invention and shows a view taken along line I-I' shown in FIG. 4a or 4b.

FIGS. 2a to 2d are views roughly showing a method of manufacturing the nitride semiconductor device in accordance with FIG. 1.

Figure 3:
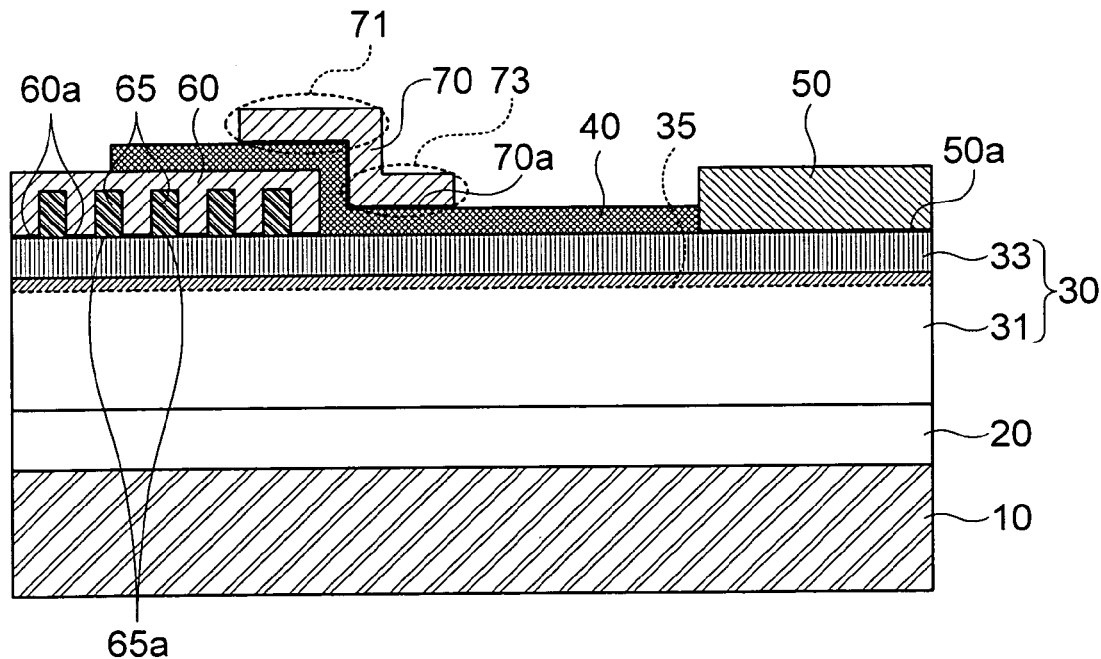
FIG. 3 is a rough cross-sectional view of a nitride semiconductor device in accordance with another embodiment of the present invention.

FIG. 3 is a rough cross-sectional view of a nitride semiconductor device in accordance with another embodiment of the present invention.

Figure 4C:
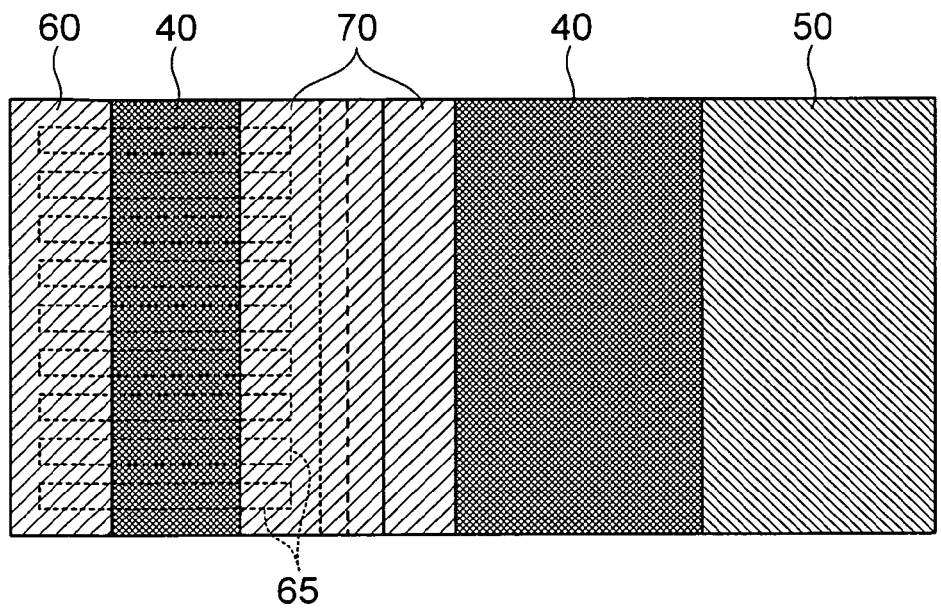

FIGS. 4a to 4c are rough plan views of a nitride semiconductor device in accordance with an embodiment of the present invention.

Figure 5:
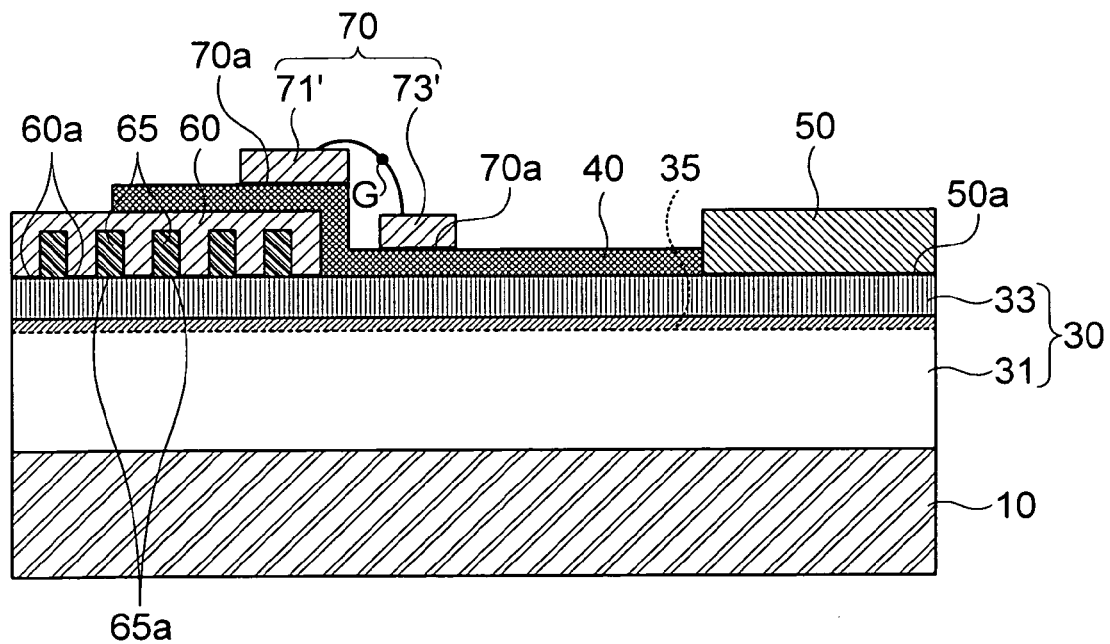
FIG. 5 is a rough cross-sectional view of a nitride semiconductor device in accordance with still another embodiment of the present invention.
Figure 6:
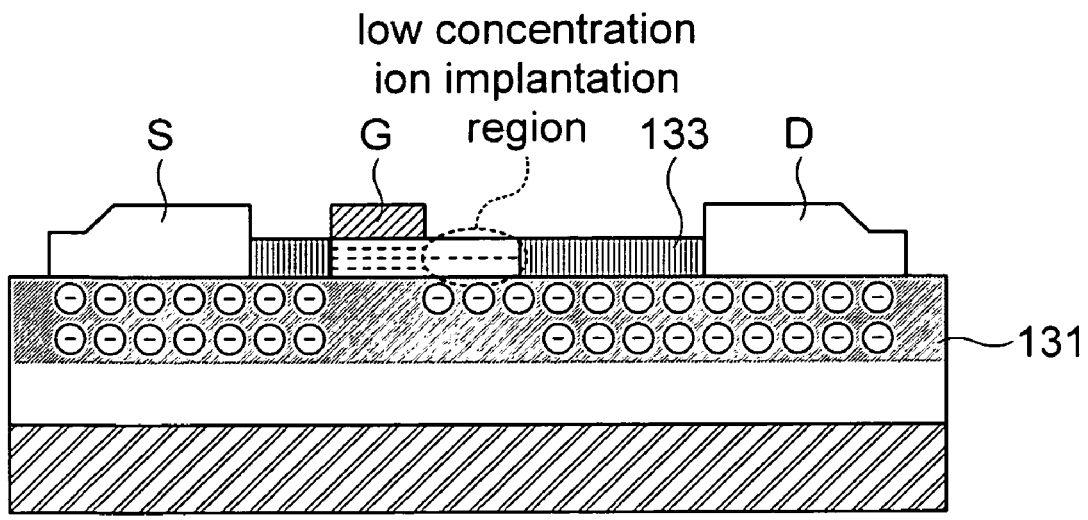
FIGS. 6 and 7 show conventional HEMT structures.
Figure 7:
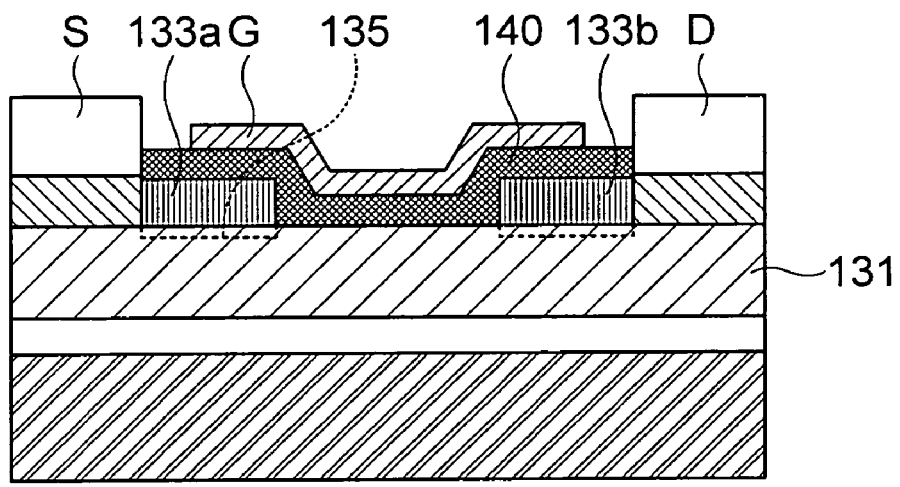

FIG. 5 is a rough cross-sectional view of a nitride semiconductor device in accordance with still another embodiment of the present invention.

First, a nitride semiconductor device in accordance with an embodiment of the present invention will be specifically described with reference to FIGS. 1, 3, 4a, 4b, 4c, or/and 5.

Referring to FIGS. 1, 3, or/and 5, a nitride semiconductor device in accordance with an embodiment of the present invention includes a nitride semiconductor layer 30, a drain electrode 50, a source electrode 60, a dielectric layer 40, and a gate electrode 70 which are disposed over a substrate 10.

Referring to FIGS. 1 or/and 5, in this embodiment, the nitride semiconductor layer 30 is disposed over the substrate 10. The substrate 10 may be a generally insulating substrate or a high resistance substrate substantially having insulation property.

In accordance with another embodiment of the present invention, in FIGS. 1, 3, or/and 5, the substrate 10 may be made of at least one of silicon (Si), silicon carbide (SiC), and sapphire ($Al_2O_3$) or other well-known substrate materials.

The nitride semiconductor layer 30 may be directly formed on the substrate 10. Preferably, the nitride semiconductor layer 30 may be formed by epitaxially growing a nitride single crystal thin film. As an epitaxial growth process for forming the nitride semiconductor layer 30, liquid phase epitaxy (LPE), chemical vapor deposition (CVD), molecular beam epitaxy (MBE), or metal-organic CVD (MOCVD) may be used.

Further, referring to FIG. 3, in accordance with another embodiment of the present invention, a buffer layer 20 may be formed between the substrate 10 and the nitride semiconductor layer 30, and the nitride semiconductor layer 30 may be formed on the buffer layer 20. The buffer layer 20 is provided so as to solve problems due to a lattice mismatch between the substrate 10 and the nitride semiconductor layer 30. The buffer layer 20 may be formed in one layer as well as a plurality of layers containing gallium nitride (GaN), aluminum gallium nitride (AlGaN), aluminum nitride (AlN), indium gallium nitride (InGaN) or indium aluminum gallium nitride (InAlGaN). Further, the buffer layer 20 may be made of group III-V compound semiconductors other than GaN. For example, when the substrate 10 is a sapphire substrate 10, growth of the buffer layer 20 is important to avoid a mismatch due to differences in lattice constant and coefficient of thermal expansion between the substrate 10 and the nitride semiconductor layer 30 containing GaN.

Referring to FIGS. 1, 3, or/and 5, a two-dimensional electron gas (2DEG) channel 35 is formed in the nitride semiconductor layer 30. When a bias voltage is applied to the gate electrode 70 of the nitride semiconductor device, electrons move through the 2DEG channel 35 in the nitride semiconductor layer 30 so that current flows between the drain electrode 50 and the source electrode 60. The nitride semiconductor layer 30 is made of nitride such as GaN, AlGaN, InGaN, or InAlGaN.

In accordance with an embodiment of the present invention, the nitride semiconductor layer 30 is a heterojunction GaN-based semiconductor layer 30, and the 2DEG channel 35 is formed in the vicinity of a heterojunction interface by an energy band gap difference. The less the difference in lattice constant between heterojunctions of the heterojunction GaN-based semiconductor layer 30 is, the less the differences in band gap and polarity are. Due to this, the formation of the 2DEG channel 35 is suppressed. Free electrons move from a material with a wide band gap to a material with a small band gap by discontinuity of the energy band gap during heterojunction. These electrons are accumulated on the heterojunction interface to form the 2DEG channel 35 so that current flows between the drain electrode 50 and the source electrode 60.

Referring to FIGS. 1, 3, or/and 5, the nitride semiconductor layer 30 includes a first nitride layer 31 and a second nitride layer 33. The first nitride layer 31 is disposed over the substrate 10 and contains a GaN-based material. The second nitride layer 33 is in heterojunction with and on the first nitride layer 31 and contains a heterogeneous GaN-based material with a wider energy band gap than the first nitride layer 31. At this time, the second nitride layer 33 plays a role of supplying electrons to the 2 DEG channel 35 formed in the first nitride layer 31. For example, it is preferred that the second nitride layer 33, which donates electrons, is formed with a thickness smaller than that of the first nitride layer 31.

Preferably, in accordance with another embodiment of the present invention, the first nitride layer 31 contains GaN, and the second nitride layer 33 contains one of AlGaN, InGaN, and InAlGaN. Preferably, in accordance with an embodiment, the first nitride layer 31 contains GaN, and the second nitride layer 33 contains AlGaN.

Continuously, configurations of embodiments of the present invention will be further described with reference to FIGS. 1, 3, 4a, 4b, 4c, or/and 5.

Referring to FIGS. 1, 3, 4a, 4b, 4c, or/and 5, the drain electrode 50 and the source electrode 60 of the nitride semiconductor device in accordance with this embodiment are formed on the nitride semiconductor layer 30. The drain electrode 50 is in ohmic contact 50a with the nitride semiconductor layer 30.

The source electrode 60 is disposed to be spaced apart from the drain electrode 50 and in Schottky contact 60a with the nitride semiconductor layer 30. According to the structure of the Schottky source electrode 60, when driven by a reverse bias, a current flow by 2DEG can be stably interrupted by a depletion region formed by a Schottky contact region 60a of the source electrode 60. Accordingly, it is possible to interrupt a reverse current flow and implement a normally-off state. More specifically, when a reverse bias voltage is applied, the depletion region formed by the Schottky contact region 60a of the source electrode 60 is expanded to the region of the 2DEG channel 35 so that the 2DEG channel 35 is blocked and a reverse breakdown voltage is increased. Especially, when the reverse bias voltage is applied, the depletion region is greatly expanded in the Schottky contact region 60a adjacent to a drain-side corner of the source electrode 60. Meanwhile, when a forward bias voltage is applied, the depletion region formed by the Schottky contact region 60a of the source electrode 60 is reduced so that current flows between the drain electrode 50 and the source electrode 60 through the 2DEG channel 35.

Further, in the present invention, as shown in FIGS. 1, 3, 4a, 4b, 4c, or/and 5, an ohmic pattern 65 is formed in the source electrode 60 to be in ohmic contact 65a with the nitride semiconductor layer 30. According to a feature of the present invention, on-resistance is reduced by increasing current supply through the ohmic pattern electrode 65 in ohmic contact 65a between Schottky contact 60a on a lower boundary surface in the source electrode 60. As on-resistance is reduced, high current operation can be performed. The source electrode 60 is in Schottky contact 60a with the nitride semiconductor layer 30 around the ohmic pattern electrode 65 by forming the ohmic pattern electrode 65 with a predetermined pattern on a lower region in the Schottky source electrode 60 before forming the Schottky metal electrode 60. Therefore, on-resistance is reduced and thus high current operation can be performed.

When describing another embodiment of the present invention with reference to FIG. 4a, the ohmic pattern 65 has a grid array structure.

When describing another embodiment of the present invention with reference to FIGS. 4b and 4c, the ohmic pattern 65 has a plurality of bar structures disposed in parallel or vertical to the drain electrode array 50.

As shown in FIGS. 4a to 4c, the ohmic pattern electrode 65 is disposed in the region of the source electrode 60 to increase current supply between the Schottky contact patterns 60a through the ohmic contact surface 65a so that on-resistance due to application of the forward bias voltage is reduced and high current operation can be performed.

Continuously, referring to FIGS. 1, 3, 4a, 4b, 4c, or/and 5, the dielectric layer 40 of the nitride semiconductor device in accordance with an embodiment of the present invention is formed on the nitride semiconductor layer 30 between the drain electrode 50 and the source electrode 60 and on at least a portion of the source electrode 60.

Preferably, in accordance with another embodiment of the present invention, in FIGS. 1, 3, 4a, 4b, 4c, or/and 5, the dielectric layer 40 may be an oxide layer and may include at least one of SiN, $SiO_2$, and $Al_2O_3$.

Continuously, referring to FIGS. 1, 3, 4a, 4b, 4c, or/and 5, the gate electrode 70 of the nitride semiconductor device in accordance with this embodiment is disposed on the dielectric layer 40 to be spaced apart from the drain electrode 50. Further, referring to FIGS. 1, 3, 4a, 4b, 4c, or/and 5, a portion 71 of the gate electrode 70 is formed over a drain-side edge portion of the source electrode 60 with the dielectric layer 40 interposed therebetween. Preferably, the gate electrode 70 is in Schottky contact 70a with the dielectric layer 40. When the forward bias voltage is applied to the gate electrode 70, the depletion region formed in the Schottky contact region 60a adjacent to the drain-side corner of the source electrode 60 is reduced so that current flows between the drain electrode 50 and the source electrode 60 through the 2DEG channel 35.

Referring to FIGS. 1, 3, and 4a to 4c, the gate structure is formed over the edge portion of the source electrode 60 and on the dielectric layer 40 between the drain electrode 50 and the source electrode 60 to distribute an electric field. Accordingly, the gate structure itself performs a role of a field plate for increasing a withstand voltage.

When describing another embodiment of the present invention with reference to FIGS. 1, 3, 4a, 4b, 4c, or/and 5, the portion 71 and 71' of the gate electrode 70, which is formed on the drain-side edge portion of the source electrode 60, is formed to cover at least a portion of the ohmic pattern 65 of the source electrode 60.

Further, another embodiment of the present invention will be described with reference to FIGS. 1 or/and 5.

Referring to FIGS. 1 or/and 5, a nitride semiconductor device in accordance with an embodiment of the present invention includes a nitride semiconductor layer 30, a drain electrode 50, a source electrode 60, a dielectric layer 40, and a gate electrode 70 which are disposed over a substrate 10. The nitride semiconductor layer 30, the drain electrode 50, the source electrode 60, and the dielectric layer 40 will refer to the above description.

In this embodiment, the gate electrode 70 includes a first region 71 and 71' and a second region 73 and 73'. The first region 71 and 71' is formed over a drain-side edge portion of the source electrode 60 with the dielectric layer 40 interposed therebetween. The second region 73 and 73' is disposed on the dielectric layer 40 between the drain electrode 50 and the source electrode 60 to be spaced apart from the drain electrode 50. The first region and the second region may be integrally formed as shown in FIG. 1 or may be separately formed as shown in FIG. 5.

Referring to FIG. 1 or/and 5, in another embodiment of the present invention, the first region 71 and 71' is formed to cover at least a portion of an ohmic pattern 65 of the source electrode 60.

When describing another embodiment of the present invention with reference to FIG. 5, the first region 71' and the second region 73' of the gate electrode 70 are separately formed. At this time, since the second region 73' performs a role of a floating gate, an electric field is distributed by the second region 73'. Preferably, the second region 73' is disposed close to the source electrode 60.

Although not shown, in accordance with another embodiment of the present invention, the nitride semiconductor device having the gate electrode 70 separated into the first region 71' and the second region 73' may include the ohmic pattern electrode 65 having a grid array structure as shown in FIG. 4a. Further, the ohmic pattern electrode 65 of the nitride semiconductor device having the gate electrode 70 separated into the first region 71' and the second region 73' may have a plurality of bar structures disposed in parallel or vertical to the drain electrode array 50 as shown in FIGS. 4b and 4c. The ohmic pattern electrode 65 is disposed in the region of the source electrode 60 so that on-resistance due to application of a forward bias voltage is reduced and high current operation can be performed.

Although not shown in FIG. 5, in accordance with another embodiment of the present invention, as shown in FIG. 3, a buffer layer 20 may be formed between the substrate 10 and the nitride semiconductor layer 30, and the nitride semiconductor layer 30 may be formed on the buffer layer 20.

In an embodiment of the present invention in accordance with FIGS. 1, 3, 4a, 4b, 4c, or/and 5, when a voltage of 0(V) is applied to the gate electrode 70, a current flow between the drain electrode 50 and the source electrode 60 through a 2DEG channel 35 is interrupted by a Schottky barrier in the region of the source electrode 60. And when a voltage higher than a threshold voltage is applied to the gate electrode 70, carrier (electron) concentration is increased in the drain-side edge region of the source electrode 60 so that current flows by a tunneling phenomenon. At this time, the threshold voltage of the gate is determined by a thickness of the dielectric layer 40. Accordingly, the nitride semiconductor device in accordance with the present invention is easily manufactured and has low leakage current and high withstand voltage characteristics, compared to a conventional normally-off (N-off) HEMT structure.

The nitride semiconductor device in accordance with the above-described embodiments is a power transistor device. The power transistor device in accordance with an embodiment of the present invention has a horizontal HEMT structure.

Next, a method of manufacturing a nitride semiconductor device in accordance with another aspect of the present invention will be described with reference to the drawings. The nitride semiconductor device described in the above embodiments and FIGS. 1, 3, 4a, 4b, 4c, or/and 5 as well as FIGS. 2a to 2d will be referred to in describing the method of manufacturing a nitride semiconductor device in accordance with the present invention. It will be the same in opposite case.

FIGS. 2a to 2d show a method of manufacturing a nitride semiconductor device in accordance with one aspect of the present invention.

Preferably, in accordance with an embodiment, a device manufactured by a method of manufacturing a nitride semiconductor device of the present invention is a power transistor.

Figure 2A:
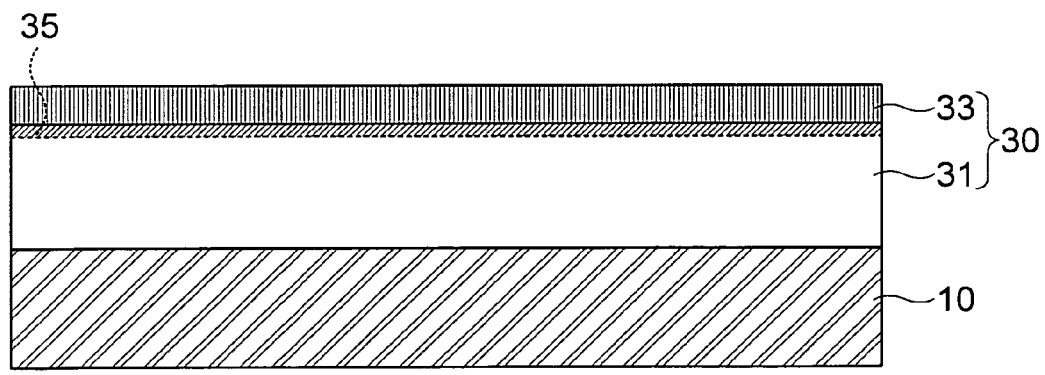
FIGS. 2a to 2d are views roughly showing a method of manufacturing the nitride semiconductor device in accordance with FIG. 1.

First, referring to FIG. 2a, a nitride semiconductor layer 30, which has a 2DEG channel 35 inside, is formed over a substrate 10. Preferably, the substrate 10 may be made of at least one of Si, SiC, and $Al_2O_3$. The nitride semiconductor layer 30 is made of nitride such as GaN, AlGaN, InGaN, or InAlGaN.

Preferably, the nitride semiconductor layer 30 may be formed by epitaxially growing a nitride single crystal thin film. Preferably, the nitride semiconductor layer 30 is selectively grown during the epitaxial growth so as not to be overgrown. If the nitride semiconductor layer 30 is overgrown, it may be additionally planarized by an etch-back process or a chemical mechanical polishing (CMP) process.

In accordance with another embodiment of a method of manufacturing a nitride semiconductor device of the present invention, a first nitride layer 31 and a second nitride layer 33 shown in FIG. 2a are formed by an epitaxial growth process. First, the first nitride layer 31 is formed by epitaxially growing a GaN-based single crystal thin film on the substrate 10. Preferably, in accordance with another embodiment of the present invention, the first nitride layer 31 is formed by epitaxially growing GaN. Next, the second nitride layer 33 is formed by epitaxially growing a nitride layer containing a heterogeneous GaN-based material with a wider energy band gap than the first nitride layer 31 by using the first nitride layer 31 as a seed layer. Preferably, in accordance with another embodiment of the present invention, the second nitride layer 33 is formed by epitaxially growing GaN-based signal crystal containing one of AlGaN, InGaN, and InAlGaN. Preferably, the second nitride layer 33 is formed by epitaxially growing AlGaN. For example, it is preferred that the second nitride layer 33, which donates electrons, is formed with a thickness smaller than that of the first nitride layer 31.

The first and second nitride layers 31 and 33 may be formed by an epitaxial growth process such as liquid phase epitaxy (LPE), chemical vapor deposition (CVD), molecular beam epixaxy (MBE), or metal-organic CVD (MOCVD).

Figure 2B:
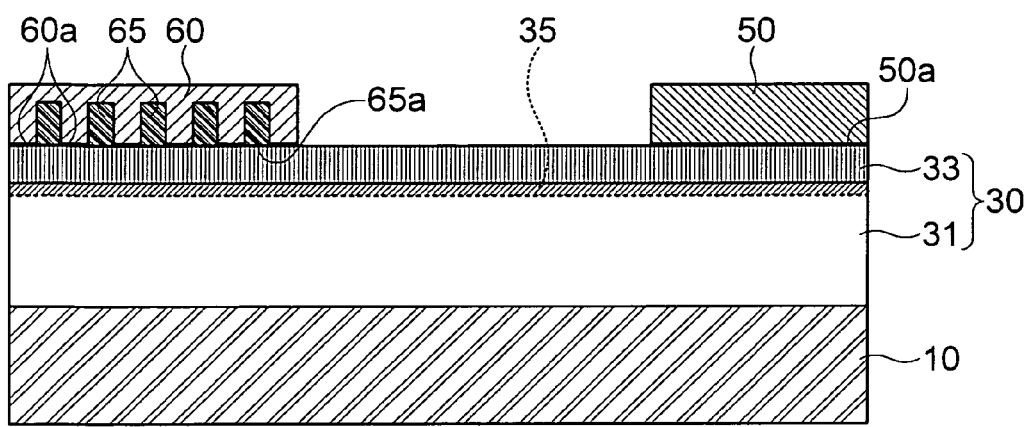

Next, referring to FIG. 2b, a drain electrode 50 and a source electrode 60 are formed on the nitride semiconductor layer 30. In FIG. 2b, the drain electrode 50 is formed to be in ohmic contact 50a with the nitride semiconductor layer 30. Heat-treatment can be performed to complete ohmic contact. The drain electrode 50 is formed on the nitride semiconductor layer 30 by using at least one metal of gold (Au), nickel (Ni), platinum (Pt), titanium (Ti), aluminum (Al), palladium (Pd), iridium (Ir), rhodium (Rh), cobalt (Co), tungsten (W), molybdenum (Mo), tantalum (Ta), copper (Cu), and zinc (Zn), metal silicide, and alloys thereof. The drain electrode 50 may be formed in a multilayer structure.

The source electrode 60 is formed to be in Schottky contact 60a with the nitride semiconductor layer 30 while being spaced apart from the drain electrode 50. The Schottky-contacted source electrode 60 is formed by using a material, which can be in Schottky contact with the nitride semiconductor layer 30, for example, at least one metal of Al, Mo, Au, Ni, Pt, Ti, Pd, Ir, Rh, Co, W, Ta, Cu, and Zn, metal silicide, and alloys thereof. The source electrode 60 may be formed in a multilayer structure. It is possible to interrupt reverse current between the drain electrode 50 and the source electrode 60 through the 2DEG channel 35 by using the Schottky contact 60a having semiconductor contact with metal in the source electrode 60.

Further, as a characteristic aspect of the present invention, as shown in FIG. 2b, an ohmic pattern 65 is formed in the source electrode 60 to be in ohmic contact 65a with the nitride semiconductor layer 30. In accordance with a feature of the present invention, on-resistance is reduced by increasing current supply through the ohmic pattern electrode 65 in ohmic contact 65a between the Schottky contact patterns 60 on a lower boundary surface in the source electrode 60. Accordingly, high current operation can be performed.

Further, when describing another embodiment of the present invention, as shown in FIG. 4a, the ohmic pattern 65 is formed by an electron beam evaporator to have a grid array structure. Further, when describing another embodiment of the present invention, as shown in FIGS. 4b and 4c, the ohmic pattern 65 is formed to have a plurality of bar structures disposed in parallel or vertical to the drain electrode array 50.

When describing a process of forming the drain electrode 50 and the source electrode 60, a metal layer for forming an electrode is formed by an electron beam evaporator on the nitride semiconductor layer 30, which is epitaxially grown on the substrate 10, and a photoresist pattern is formed on the metal layer. And the metal electrodes 50 and 60 are formed by etching the metal layer using the photoresist pattern as an etching mask and removing the photoresist pattern.

At this time, in accordance with another embodiment of the present invention, after the ohmic pattern electrode 65 with a uniform pattern is formed in a portion of the region of the source electrode 60 simultaneously with forming the drain ohmic electrode 50 or through an additional ohmic metal deposition process after forming the drain ohmic electrode 50, the Schottky contact electrode is formed in the remaining region of the source electrode 60.

Figure 2C:
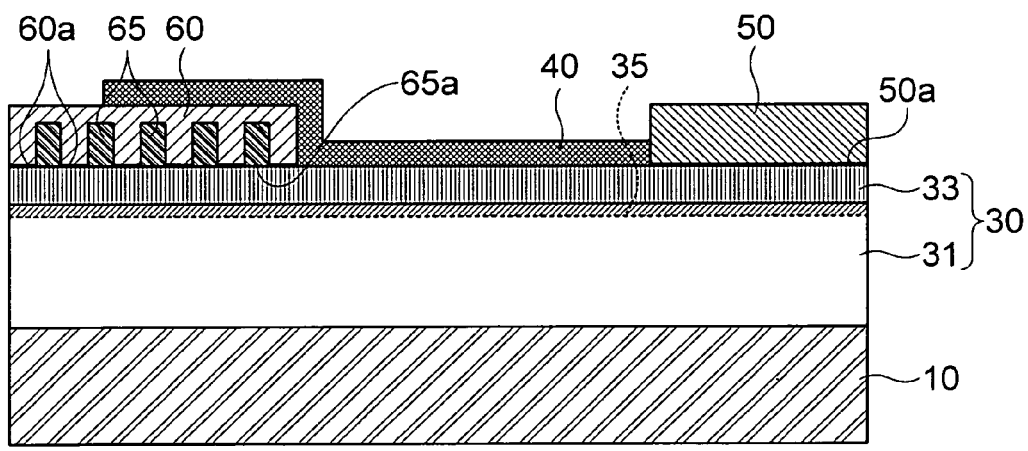

Referring to FIG. 2c, in an embodiment of the present invention, after forming the drain electrode 50 and the source electrode 60, a dielectric layer 40 is formed on the nitride semiconductor layer 30 between the drain electrode 50 and the source electrode 60. At this time, the dielectric layer 40 is formed on at least a portion of the source electrode 60, preferably, on a portion of the source electrode 60 in the direction of the drain electrode 50. Preferably, the dielectric layer 40 may be an oxide layer or may include at least one of SiN, $SiO_2$, and $Al_2O_3$ in accordance with an embodiment.

Figure 2D:
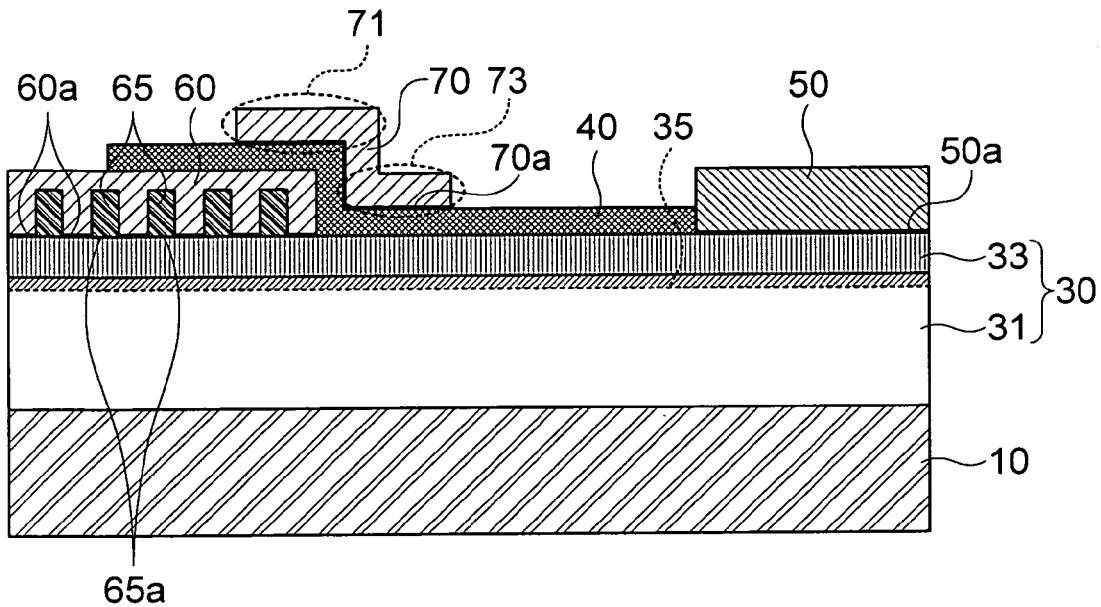

Referring to FIG. 2d, in an embodiment of the present invention, after forming the dielectric layer 40 in accordance with FIG. 2c, a gate electrode 70 is formed on the dielectric layer 40 to be spaced apart from the drain electrode 50. At this time, referring to FIG. 2d, a portion of the gate electrode 70 is formed on the dielectric layer 40 over a drain-side edge portion of the source electrode 60. The gate electrode 70 may be made of at least one metal of Al, Mo, Au, Ni, Pt, Ti, Pd, Ir, Rh, Co, W, Ta, Cu, and Zn, metal silicide, and alloys thereof. The gate electrode 70 may use a metal different from those of the drain electrode 50 or/and the source electrode 60 and may be formed in a multilayer structure. Preferably, the gate electrode 70 is in Schottky contact 70a with the dielectric layer 40.

In accordance with another embodiment of the present invention, in the step of forming the gate electrode 70, the portion 71 and 71' of the gate electrode 70, which is formed on the drain-side edge portion of the source electrode 60, is formed to cover at least a portion of the ohmic pattern 65 of the source electrode 60.

When describing a process of forming the gate electrode 70 in accordance with an embodiment of the present invention, a metal layer for forming an electrode is formed on the dielectric layer 40 by an electron beam evaporator, and a photoresist pattern is formed on the metal layer so that the portion of the gate electrode 70 is formed on the dielectric layer 40 on the drain-side edge portion of the source electrode 60. And the metal layer is etched by using the photoresist pattern as an etching mask. The metal electrode is formed by removing the photoresist pattern after etching.

Further, when describing another embodiment of the present invention with reference to FIGS. 2d and 5, the gate electrode 70 includes a first region 71 and a second region 73. The first region 71 of the gate electrode 70 is formed over the drain-side edge portion of the source electrode 60 with the dielectric layer 40 interposed therebetween, and the second region 73 of the gate electrode 70 is formed on the dielectric layer 40 between the drain electrode 50 and the source electrode 60 to be spaced apart from the drain electrode 50. The first region 71 and the second region 73 may be integrally formed as shown in FIG. 2d or may be separately formed as shown in FIG. 5.

When describing another embodiment of the present invention with reference to FIGS. 2d and 5, in the step of forming the gate electrode 70, the first region 71 and 71' is formed to cover at least the portion of the ohmic pattern 65 of the source electrode 60.

When describing another embodiment of the present invention with reference to FIG. 5, in the step of forming the gate electrode 70, the first region 71 and the second region 73 of the gate electrode 70 are separately formed, and the second region 73 is formed as a floating gate on the dielectric layer 40 between the drain electrode 50 and the source electrode 60.

In accordance with another embodiment of a method of manufacturing a nitride semiconductor device of the present invention, referring to FIG. 3, before forming the nitride semiconductor layer 30 over the substrate 10 shown in FIG. 2a, the step of forming a buffer layer 20 over the substrate 10 is further included. The buffer layer 20 is provided to solve problems due to a lattice mismatch between the substrate 10 and the nitride semiconductor layer 30. The buffer layer 20 may be formed in one layer as well as a plurality of layers containing GaN, AlGaN, AlN, InGaN, or InAlGaN.

In accordance with one aspect of the present invention, it is possible to obtain a semiconductor device capable of normally-off (N-off) or enhancement-mode operation by forming a Schottky electrode, which has an ohmic pattern electrode inside, in a source region of a semiconductor device, for example, an FET and forming a gate electrode in a portion of a source electrode region and in a portion of a nitride semiconductor region.

A semiconductor device and a manufacturing method thereof in accordance with an embodiment of the present invention can perform high withstand voltage and high current operation compared to a conventional GaN normally-off device and facilitate manufacture of the device by simple manufacturing processes. That is, since difficult processes such as ion implantation and etching of an AlGaN layer with a thickness of 200 to 300 Å of the conventional normally-off HEMT are not required, the manufacture of the device is facilitated.

Further, in accordance with an embodiment of the present invention, it is possible to achieve low leakage current and high withstand voltage compared to the conventional normally-off HEMT by a structure in which leakage current is prevented by a Schottky barrier of the source electrode, and it is possible to perform high current operation by forming an ohmic pattern electrode in the Schottky source electrode to reduce on-resistance.

Furthermore, in accordance with an embodiment of the present invention, since the gate structure is formed over an edge portion of the source electrode and on a dielectric layer between a drain electrode and the source electrode to distribute an electric field, it can perform a role of a field plate for increasing a withstand voltage at the same time. Further, it is possible to increase transconductance by reducing a distance between the source electrode and the gate electrode.

It will be apparent that various effects, which are not directly stated in accordance with various embodiments of the present invention, can be derived from various configurations in accordance with embodiments of the present invention by those skilled in the art.

The above-described embodiments and the accompanying drawings are provided as examples to help understanding of those skilled in the art, not limiting the scope of the present invention. Therefore, the various embodiments of the present invention may be embodied in different forms in a range without departing from the essential concept of the present invention, and the scope of the present invention should be interpreted from the invention defined in the claims. It is to be understood that the present invention includes various modifications, substitutions, and equivalents by those skilled in the art.

What is claimed is:

1. A nitride semiconductor device comprising:
   a nitride semiconductor layer over a substrate wherein the nitride semiconductor has a two-dimensional electron gas (2DEG) channel inside;
   a drain electrode in ohmic contact with the nitride semiconductor layer;
   a source electrode spaced apart from the drain electrode, in Schottky contact with the nitride semiconductor layer, and having an ohmic pattern in ohmic contact with the nitride semiconductor layer inside;
   a dielectric layer formed on the nitride semiconductor layer between the drain electrode and the source electrode and on at least a portion of the source electrode; and
   a gate electrode disposed on the dielectric layer to be spaced apart from the drain electrode, wherein a portion of the gate electrode is formed over a drain-side edge portion of the source electrode with the dielectric layer interposed therebetween.

2. The nitride semiconductor device according to claim 1, wherein the portion of the gate electrode being formed over the drain-side edge portion of the source electrode is formed to cover at least a portion of the ohmic pattern of the source electrode.

3. The nitride semiconductor device according to claim 1, wherein the ohmic pattern has a grid array structure.

4. The nitride semiconductor device according to claim 1, wherein the ohmic pattern has a plurality of bar structures disposed in parallel or vertical to the drain electrode array.

5. The nitride semiconductor device according to claim 1, wherein the nitride semiconductor layer comprises:
   a first nitride layer over the substrate wherein the first nitride layer contains a gallium nitride (GaN)-based material; and
   a second nitride layer in heterojunction with and on the first nitride layer wherein the second nitride layer contains a heterogeneous GaN-based material with a wider energy band gap than the first nitride layer.

6. The nitride semiconductor device according to claim 5, wherein the first nitride layer contains GaN, and the second nitride layer contains one of aluminum gallium nitride (AlGaN), indium gallium nitride (InGaN), and indium aluminum gallium nitride (InAlGaN).

7. The nitride semiconductor device according to claim 1, further comprising:
   a buffer layer formed between the substrate and the nitride semiconductor layer.

8. The nitride semiconductor device according to claim 1, wherein the substrate uses at least one of silicon (Si), silicon carbide (SiC), and sapphire ($Al_2O_3$).

9. The nitride semiconductor device according to claim 1, wherein the dielectric layer contains at least one of SiN, $SiO_2$, and $Al_2O_3$.

10. The nitride semiconductor device according to claim 1, wherein the nitride semiconductor device is a power transistor device.

11. A nitride semiconductor device comprising:
    a nitride semiconductor layer over a substrate wherein the nitride semiconductor has a 2DEG channel inside;
    a drain electrode in ohmic contact with the nitride semiconductor layer;
    a source electrode spaced apart from the drain electrode, in Schottky contact with the nitride semiconductor layer, and having an ohmic pattern in ohmic contact with the nitride semiconductor layer inside;
    a dielectric layer formed on the nitride semiconductor layer between the drain electrode and the source electrode and on at least a portion of the source electrode; and
    a gate electrode having a first region formed over a drain-side edge portion of the source electrode with the dielectric layer interposed therebetween and a second region disposed on the dielectric layer between the drain electrode and the source electrode to be spaced apart from the drain electrode.

12. The nitride semiconductor device according to claim 11, wherein the first region is formed to cover at least a portion of the ohmic pattern of the source electrode.

13. The nitride semiconductor device according to claim 11, further comprising:
    a buffer layer formed between the substrate and the nitride semiconductor layer.

14. The nitride semiconductor device according to claim 11, wherein the first region and the second region of the gate electrode are separately formed, and the second region forms a floating gate.

15. The nitride semiconductor device according to claim 14, wherein the ohmic pattern has a grid array structure.

16. The nitride semiconductor device according to claim 14, wherein the ohmic pattern has a plurality of bar structures disposed in parallel or vertical to the drain electrode array.

17. The nitride semiconductor device according to claim 14, wherein the nitride semiconductor layer comprises:
    a first nitride layer over the substrate wherein the first nitride layer contains a GaN-based material; and
    a second nitride layer in heterojunction with and on the first nitride layer wherein the second nitride layer contains a heterogeneous GaN-based material with a wider energy band gap than the first nitride layer.

* * * * *